(12) United States Patent
Li et al.

(10) Patent No.: US 11,497,134 B2
(45) Date of Patent: Nov. 8, 2022

(54) CABLE MANAGEMENT RACK AND CABLE MANAGEMENT APPARATUS FOR A SERVER CABINET

(71) Applicant: DONGGUAN LUXSHARE TECHNOLOGIES CO., LTD, Dongguan (CN)

(72) Inventors: Tiesheng Li, Dongguan (CN); Sihai Yi, Dongguan (CN); Hongji Chen, Dongguan (CN); Liang Ma, Dongguan (CN); Qiongnan Chen, Dongguan (CN); Rongzhe Guo, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 13 days.

(21) Appl. No.: 17/141,547

(22) Filed: Jan. 5, 2021

(65) Prior Publication Data
US 2022/0007535 A1  Jan. 6, 2022

(30) Foreign Application Priority Data
Jul. 2, 2020  (CN) .......................... 202021280950.1

(51) Int. Cl.
*H05K 7/14* (2006.01)
*H05K 5/02* (2006.01)

(52) U.S. Cl.
CPC ......... *H05K 7/1491* (2013.01); *H05K 5/0247* (2013.01)

(58) Field of Classification Search
CPC .......................... H05K 7/1491; H05K 5/0247
See application file for complete search history.

(56) References Cited

U.S. PATENT DOCUMENTS

| 8,124,887 B2* | 2/2012 | Suzuki ................. H02G 3/0691 174/72 A |
| 9,348,104 B2* | 5/2016 | Thijs .................... G02B 6/4471 |
| 2021/0044094 A1* | 2/2021 | Lawrence ............ H05K 7/1491 |

FOREIGN PATENT DOCUMENTS

WO  WO-2019191401 A1 * 10/2019  ........... H02G 3/0418

* cited by examiner

*Primary Examiner* — James Wu
*Assistant Examiner* — Hung Q Dang
(74) *Attorney, Agent, or Firm* — Birch, Stewart, Kolasch & Birch, LLP

(57) ABSTRACT

Provided are a cable management rack and a cable management apparatus for a server cabinet. The cable management rack includes a plurality of cable-bundling units sequentially connected, where each of the plurality of cable-bundling units includes a first cable-bundling piece; a second cable-bundling piece, which is detachably connected to the first cable-bundling piece; a through hole for cables to pass through, which is formed between the second cable-bundling piece and the first cable-bundling piece; and a plurality of cable guide outlets, which are formed on the first cable-bundling piece and the second cable-bundling piece and are spaced apart and distributed along an extending direction of the through hole. Each cable guide outlet is provided with a guide structure to guide an outlet direction of a cable. Two adjacent cable-bundling units are detachably connected, and through holes of the plurality of cable-bundling units are sequentially communicated.

13 Claims, 9 Drawing Sheets

CABLE MANAGEMENT RACK AND CABLE MANAGEMENT APPARATUS FOR A SERVER CABINET

CROSS-REFERENCE TO RELATED APPLICATION

This application claims priority to Chinese Patent Application No. 202021280950.1 filed Jul. 2, 2020, the disclosure of which is incorporated herein by reference in its entirety.

TECHNICAL FIELD

The present disclosure relates to the technical field of network equipment and, in particular, to a cable management rack and a cable management apparatus for a server cabinet.

BACKGROUND

A server cabinet is used for combining mounting panels, plug-ins, subracks, electronic elements, devices and the mechanical parts and components to form an integral mounting box. In most cases, a server needs to be placed in the server cabinet, and each server cabinet contains a plurality of servers. To ensure the normal operation of each server, cables such as power lines, data lines and network lines are used for connecting various servers with switches, thus leading to a large number of cables and making it difficult to distinguish the cable sequence and manage cables.

SUMMARY

The present disclosure provides a cable management rack which can facilitate cable management and cable sequence distinguishing.

The present disclosure further provides a cable management apparatus for a server cabinet through which the cables can be delivered after being integrally assembled, and thus the cable routing is regular and the wiring efficiency is improved.

To achieve the objects, the present disclosure adopts technical solutions described below.

A cable management rack is provided, is assembled in a server cabinet and includes a plurality of cable-bundling units sequentially connected. Each of the plurality of cable-bundling units includes a first cable-bundling piece and a second cable-bundling piece, which is detachably connected to the first cable-bundling piece. A through hole for cables to pass through is formed between the second cable-bundling piece and the first cable-bundling piece, and a plurality of cable guide outlets are formed on the first cable-bundling piece and the second cable-bundling piece and are spaced apart and distributed along an extending direction of the through hole. Each of the plurality of cable guide outlets is provided with a guide structure to guide an outlet direction of a cable.

Two adjacent cable-bundling units are detachably connected, and through holes of the plurality of cable-bundling units are sequentially communicated.

Optionally, the guide structure has an included angle θ relative to the first cable-bundling piece and the second cable-bundling piece, and the cable is obliquely led out through each of the plurality of cable guide outlets.

Optionally, the guide structure includes a first guide portion and a second guide portion, the first guide portion is internally provided with a first guide groove, the second guide portion is internally provided with a second guide groove; and in a case where the first cable-bundling piece is connected to the second cable-bundling piece, the first guide portion is butted against the second guide portion to form each of the plurality of cable guide outlets.

Optionally, a plurality of cable-bundling sleeves are included, and the plurality of cable-bundling sleeves are spaced apart and sleeved on the cables in the through hole.

Optionally, each of the plurality of cable-bundling units further includes a first connecting structure, which is disposed at one end of the first cable-bundling piece and the second cable-bundling piece, and a second connecting structure, which is disposed at the other end of the first cable-bundling piece and the second cable-bundling piece. The first connecting structure of each of the plurality of cable-bundling units is connected to a second connecting structure of an adjacent cable-bundling unit.

Optionally, the first connecting structure includes a first splicing section and a plurality of first engaging protrusions, and the first splicing section is disposed at the one end of the first cable-bundling piece and the second cable-bundling piece.

The second connecting structure includes a second splicing section, the second splicing section is disposed at the other end of the first cable-bundling piece and the second cable-bundling piece, and the second splicing section is provided with a plurality of first engaging holes.

The end of each of the plurality of cable-bundling units provided with the plurality of first engaging holes is spliced with an end of the adjacent cable-bundling unit provided with the plurality of first engaging protrusions, and each of the plurality of first engaging protrusions is engaged with one first engaging hole.

A cable management apparatus for a server cabinet is provided. The server cabinet is provided with a plurality of brackets arranged up and down for supporting servers and includes a plurality of cable management racks. A part of the plurality of cable management racks are vertically disposed in the server cabinet, and the other part of the plurality of brackets are horizontally disposed on the plurality of brackets. One ends of a plurality of cables are connected to one vertically disposed cable management rack, and the other ends of the plurality of cables are connected to one horizontally disposed cable management rack. Two ends of each of the plurality of cables respectively pass through cable guide outlets on the corresponding cable management racks, and the plurality of cables passing through the one horizontally disposed cable management rack are connected to at least one server. Each server is connected to at least one horizontally disposed cable management rack, and each horizontally disposed cable management rack is connected to one vertically disposed cable management rack.

Optionally, one column of cable guide outlets is formed on a cable-bundling unit of each of the vertically disposed cable management racks. A first cable-bundling piece and a second cable-bundling piece are in U-shaped structures, and an opening side of the first cable-bundling piece is butted against an opening side of the second cable-bundling piece.

Optionally, outer sides of two opposite side walls of the first cable-bundling piece are each provided with second engaging protrusions distributed along an extending direction of a through hole, two opposite side walls of the second cable-bundling piece are each provided with second engaging holes corresponding to the second engaging protrusions, and each second engaging protrusion is engaged with one second engaging hole.

Optionally, outer sides of two opposite side walls of the first cable-bundling piece are each provided with engaging portions distributed along an extending direction of a through hole, two opposite side walls of the second cable-bundling piece are each provided with engaging recesses corresponding to the engaging portions, and each the engaging portion is engaged with one engaging recess.

Optionally, two columns of cable guide outlets are formed in a cable-bundling unit of each of the horizontally disposed cable management racks. Two side edges of the first cable-bundling piece connected to the second cable-bundling piece are separately provided with first guide portions extending along an extending direction of a through hole, and each of the first guide portions is internally provided with a first guide groove. Two side edges of the second cable-bundling piece connected to the first cable-bundling piece are separately provided with second guide portions extending along the extending direction of the through hole, and each of the second guide portions is internally provided with a second guide groove. In a case where the first cable-bundling piece is connected to the second cable-bundling piece, each of the first guide portions is butted against one second guide portion to form the cable guide outlet.

Optionally, the cable-bundling unit further includes a plurality of fasteners, where two ends of each of the plurality of fasteners are detachably connected, and the plurality of fasteners is spaced apart and wound around the first cable-bundling piece and the second cable-bundling piece along the extending direction of the through hole.

Optionally, a floating connecting structure is included. An end part of a cable on each of the horizontally disposed cable management racks is connected with a plug which is for being plugged in an interface on a server, and the plug is connected to the interface through the floating connecting structure. The floating connecting structure includes a mounting plate, a floating plate, a resilient member and a first connecting member. The mounting plate includes a slot, where an opening of the slot faces towards the interface. The floating plate is movably disposed in the slot, where the plug is located in the slot and penetrates through the floating plate, and the cable connected to the plug penetrates through the mounting plate. Two ends of the resilient member are respectively connected to the mounting plate and the floating plate. The first connecting member is disposed on the mounting plate, and connects the mounting plate and a server body.

Optionally, the floating connecting structure further includes a guide member, and the guide member includes a guide post and a guide sleeve. In a case where the plug is plugged in the interface, the guide post is connected to the mounting plate, and the guide sleeve is disposed on a side part of the interface.

Figure 1:
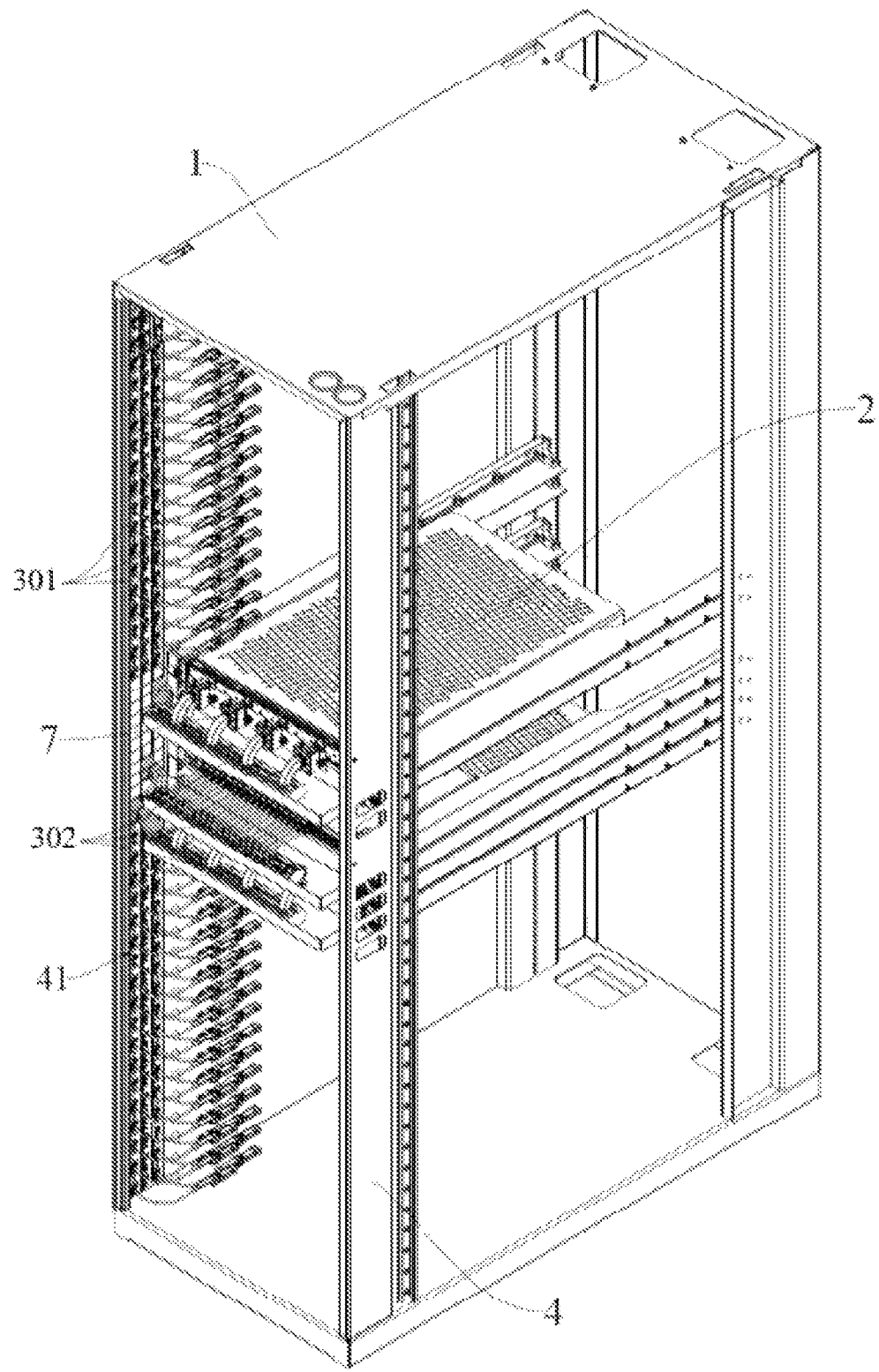
FIG. 1 is a schematic drawing of a cable management apparatus for a server cabinet according to an embodiment of the present disclosure.

REFERENCE LIST 1 server cabinet
2 server
21 server body
22 interface
3 cable management rack
31 cable-bundling unit
31a guide structure
311 first cable-bundling piece
3111 engaging portion
3112 first guide portion
31121 first guide groove
3113 second engaging protrusion
312 second cable-bundling piece
3121 engaging recess
3122 second guide portion
31221 second guide groove
3123 second engaging hole
313 second connecting structure
3131 second splicing section
3132 first engaging hole
314 first connecting structure
3141 first splicing section
3142 first engaging protrusion
315 fastener
3151 body
3152 hook
3153 hanging hole
316 cable guide outlet
317 through hole
32 cable-bundling sleeve
4 stand
41 mounting groove
5 cable
6 plug
7 floating connecting structure
71 mounting plate
711 slot
72 floating plate
73 guide member
731 guide post
732 guide sleeve
74 resilient member
75 first connecting member
76 second connecting member
761 standoff

762 stud

DETAILED DESCRIPTION

In the description of the present disclosure, it should be noted that the orientations or position relations indicated by terms such as "center", "above", "below", "left", "right", "vertical", "horizontal", "inside", "outside" and the like are based on orientations or position relations shown in the drawings. These orientations or position relations are intended only to facilitate and simplify description of the present disclosure, and not to indicate or imply that a device or element referred to must have such specific orientations or must be configured or operated in such specific orientations. Thus, these orientations or position relations are not to be construed as limiting the present disclosure. In addition, terms such as "first" and "second" are used merely for the purpose of description and are not to be construed as indicating or implying relative importance. For example, the terms "first position" and "second position" are two different positions.

Unless otherwise expressly specified and limited, the term "mounting", "connected to each other", "connected" or "secured" is to be construed in a broad sense, for example, as securely connected or detachably connected; mechanically connected or electrically connected; directly connected to each other or indirectly connected to each other via an intermediary; or internally connected between two elements or interactional relations between two elements. For those of ordinary skill in the art, specific meanings of the preceding terms in the present disclosure may be understood based on specific situations.

Unless otherwise expressly specified and limited, when a first feature is described as "on" or "below" a second feature, the first feature and the second feature may be in direct contact or be in contact via another feature between the two features instead of being in direct contact. Moreover, when the first feature is described as "on", "above" or "over" the second feature, the first feature is right on, above or over the second feature or the first feature is obliquely on, above or over the second feature, or the first feature is simply at a higher level than the second feature. When the first feature is described as "under", "below" or "underneath" the second feature, the first feature is right under, below or underneath the second feature or the first feature is obliquely under, below or underneath the second feature, or the first feature is simply at a lower level than the second feature.

Solutions of the present disclosure are further described below through embodiments in conjunction with FIGS. 1 to 12.

As shown in FIGS. 2 to 9, the present embodiment provides a cable management rack 3, and the cable management rack 3 is assembled in a server cabinet 1. The cable management rack 3 includes a plurality of sequentially-connected cable-bundling units 31, and each cable-bundling unit 31 includes a first cable-bundling piece 311 and a second cable-bundling piece 312 detachably connected to the first cable-bundling piece 311. A through hole 317 for cables to pass through is formed between the second cable-bundling piece 312 and the first cable-bundling piece 311 for a cable 5, and a plurality of cable guide outlets 316 are formed on the first cable-bundling piece 311 and the second cable-bundling piece 312 and are spaced apart and distributed along an extending direction of the through hole 317. The plurality of cable guide outlets 316 are provided with guide structures 31a to guide the outlet directions of the cables 5. Two adjacent cable-bundling units 31 are detachably connected, and the through holes 317 of the plurality of cable-bundling units 31 are sequentially communicated.

In the present embodiment, the cables 5 can be accommodated in the through hole 317 of the first cable-bundling piece 311 and the second cable-bundling piece 312, and the cables 5 accommodated in the first cable-bundling piece 311 and the second cable-bundling piece 312 can be led out through different cable guide outlets 316, so that management of cables and distinguishing between different cables 5 are facilitated. Two adjacent cable-bundling units 31 are detachably connected, and the through holes 317 of the plurality of cable-bundling units 31 are sequentially communicated, so that the cables 5 of different lengths can be conveniently accommodated in the through holes 317.

Figure 4:
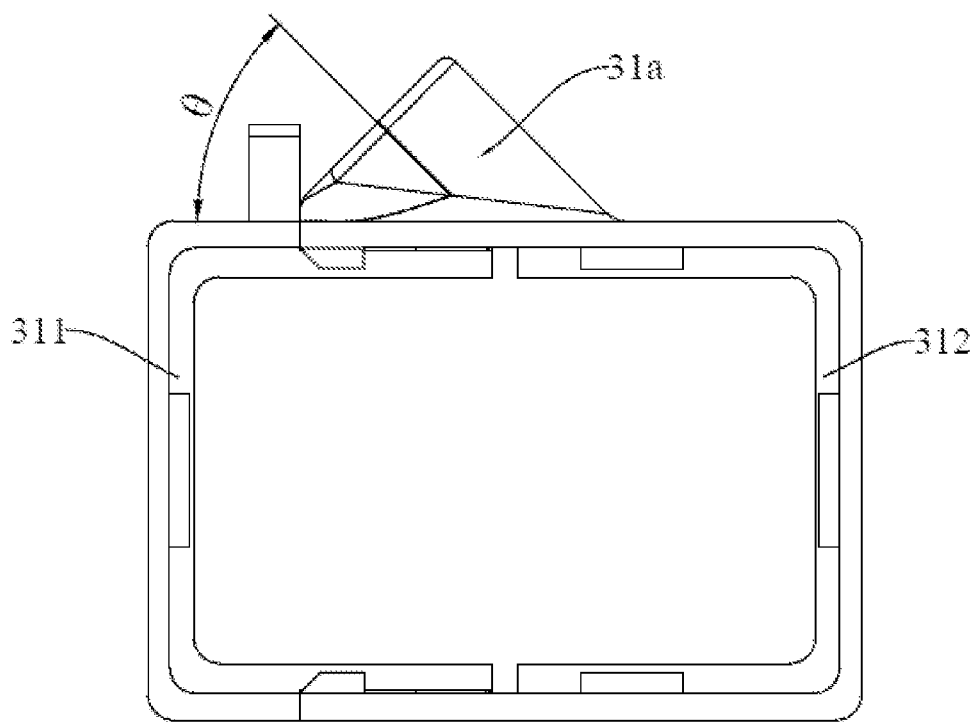
FIG. 4 is a side view of a cable-bundling unit according to an embodiment of the present disclosure.

In order to make the wiring of the cables 5 more regular, as shown in FIG. 4, the guide structure 31a has an included angle θ relative to the first cable-bundling piece 311 and the second cable-bundling piece 312, one cable 5 is obliquely led out through the cable guide outlet 316, and each cable 5 is led out through a different cable guide outlet 316, so that management of cables and distinguishing between different cables 5 are further facilitated. Optionally, the included angle θ of the guide structure 31a relative to the first cable-bundling piece 311 and the second cable-bundling piece 312 may be between 30 degrees and 90 degrees, for example, may be set to 30 degrees, 35 degrees, 45 degrees, 60 degrees, 70 degrees, 80 degrees, 90 degrees, or the like. Whether the included angle θ is set to an oblique angle for leading out the cables or a right angle for leading out the cables can be determined according to the setting position of components of the server cabinet 1 manufactured, thus leading out the cables more accurately.

Figure 5:
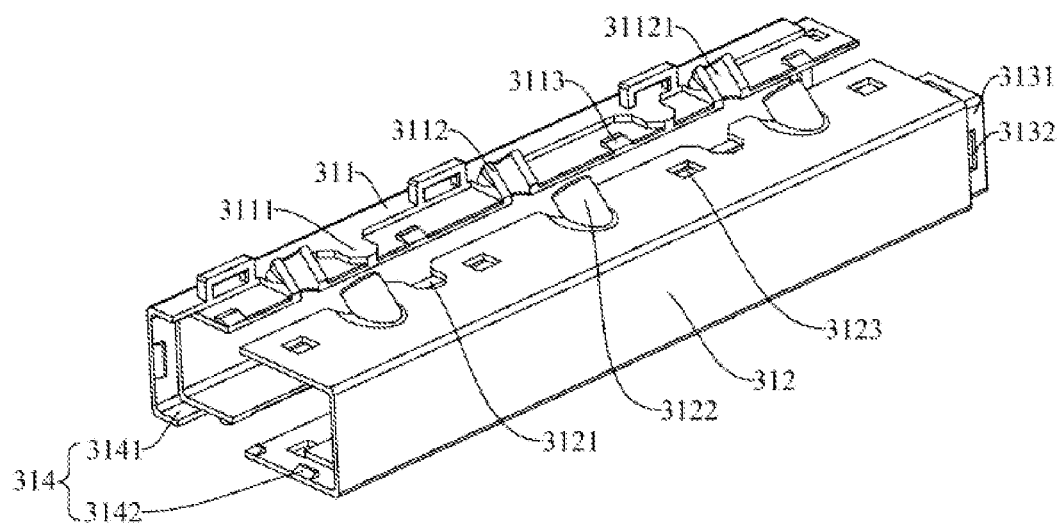
FIG. 5 is an exploded view of a cable-bundling unit according to an embodiment of the present disclosure.
Figure 7:
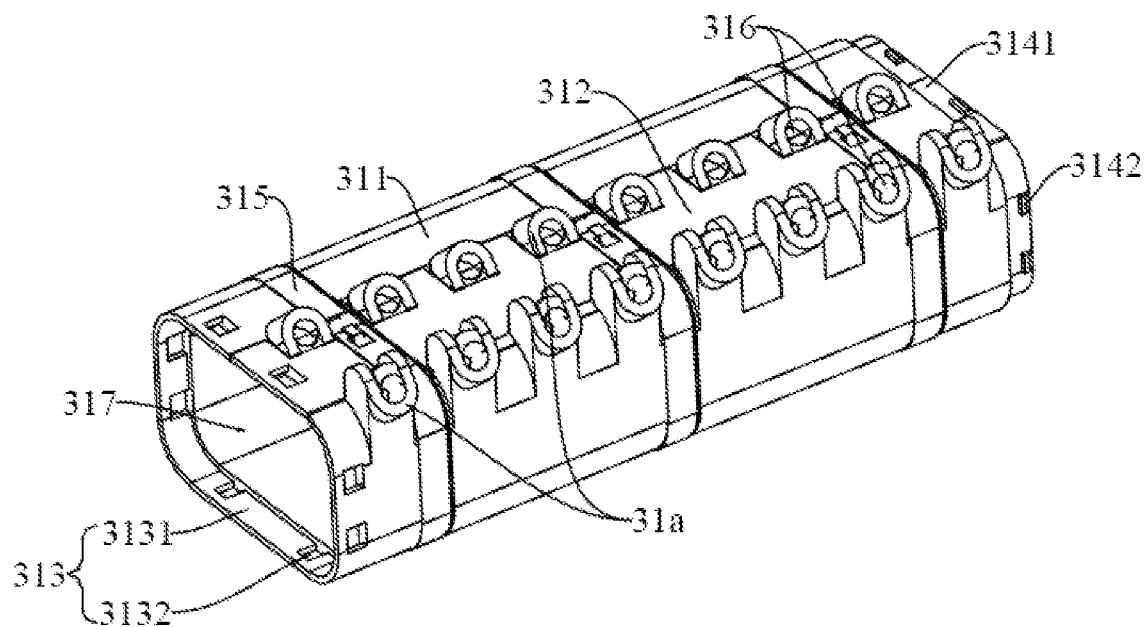
FIG. 7 is a schematic drawing of a cable-bundling unit according to another embodiment of the present disclosure.

Specifically, as shown in FIGS. 5 and 7, the guide structure 31a includes a first guide portion 3112 and a second guide portion 3122, the first guide portion 3112 is internally provided with a first guide groove 31121, the second guide portion 3122 is internally provided with a second guide groove 31221, the first cable-bundling piece 311 and the second cable-bundling piece 312 are connected, and each first guide portion 3112 is butted against one second guide portion 3122 to form a cable guide outlet 316. Optionally, the first guide portion 3112 and the second guide portion 3122 are both a protrusion structure protruding from the first cable-bundling piece 311 or the second cable-bundling piece 312, and thus can improve the strength of the first cable-bundling piece 311 and the second cable-bundling piece 312.

As shown in FIGS. 2 to 8, the cable-bundling unit 31 further includes a first connecting structure 314 and a second connecting structure 313, and the first connecting structure 314 is disposed at one end of the first cable-bundling piece 311 and the second cable-bundling piece 312. The second connecting structure 313 is disposed at the other end of the first cable-bundling piece 311 and the second cable-bundling piece 312. A first connecting structure 314 of each cable-bundling unit 31 is connected to a second connecting structure 313 of an adjacent cable-bundling unit 31. Specifically, the first connecting structure 314 and the second connecting structure 313 are formed after the first cable-bundling piece 311 and the second cable-bundling piece 312 are assembled. The first connecting structure 314 and the second connecting structure 313 are provided so that the plurality of cable-bundling units 31 can be conveniently connected, and batch processing of the first cable-bundling pieces 311 and the second cable-bundling pieces 312 can be facilitated.

Optionally, the first connecting structure 314 includes a first splicing section 3141 and a plurality of first engaging protrusions 3142, and the first splicing section 3141 is disposed at one end of the first cable-bundling piece 311 and the second cable-bundling piece 312. The second connecting structure 313 includes a second splicing section 3131, the second splicing section 3131 is disposed at the other end of the cable-bundling unit 31, and the second splicing section 3131 is provided with a plurality of first engaging holes 3132. The end of the cable-bundling unit 31 provided with the first engaging hole 3132 is spliced with the end of the adjacent cable-bundling unit 31 provided with the first engaging protrusion 3142, and each first engaging protrusion 3142 is engaged into one first engaging hole 3132. Specifically, a stepped surface is circumferentially formed along the inner walls of one end part of the first cable-bundling piece 311 and the second cable-bundling piece 312, and the first splicing section 3141 is formed after the first cable-bundling piece 311 and the second cable-bundling piece 312 are connected. Similarly, a stepped surface is circumferentially formed along the outer walls of the other end part of the first cable-bundling piece 311 and the second cable-bundling piece 312, and the second splicing section 3131 is formed after the first cable-bundling piece 311 and the second cable-bundling piece 312 are connected. After the first splicing section 3141 and the second splicing section 3131 are spliced with each other, the adjacent two cable-bundling units 31 can be reliably connected through the engagement of the first engaging protrusion 3142 and the first engaging hole 3132.

Figure 2:
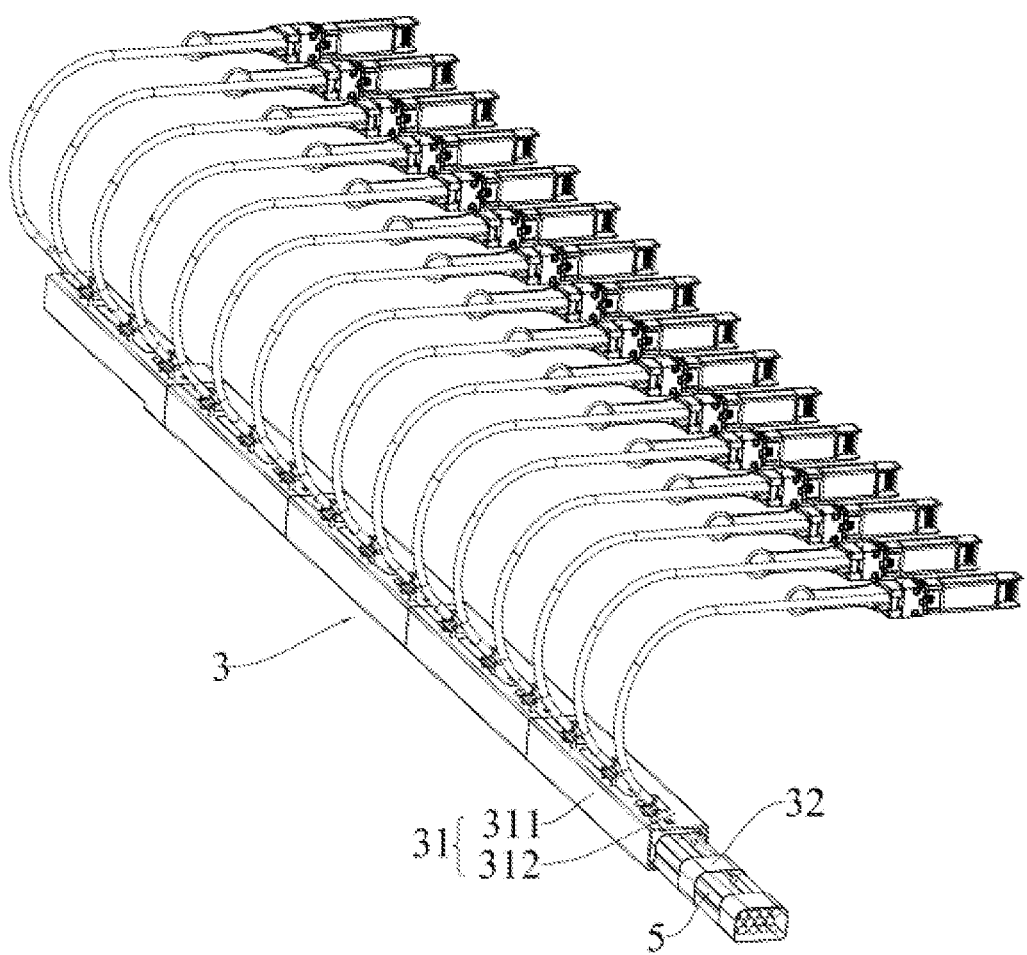
FIG. 2 is a schematic drawing of a cable management rack and cables according to an embodiment of the present disclosure.
Figure 6:
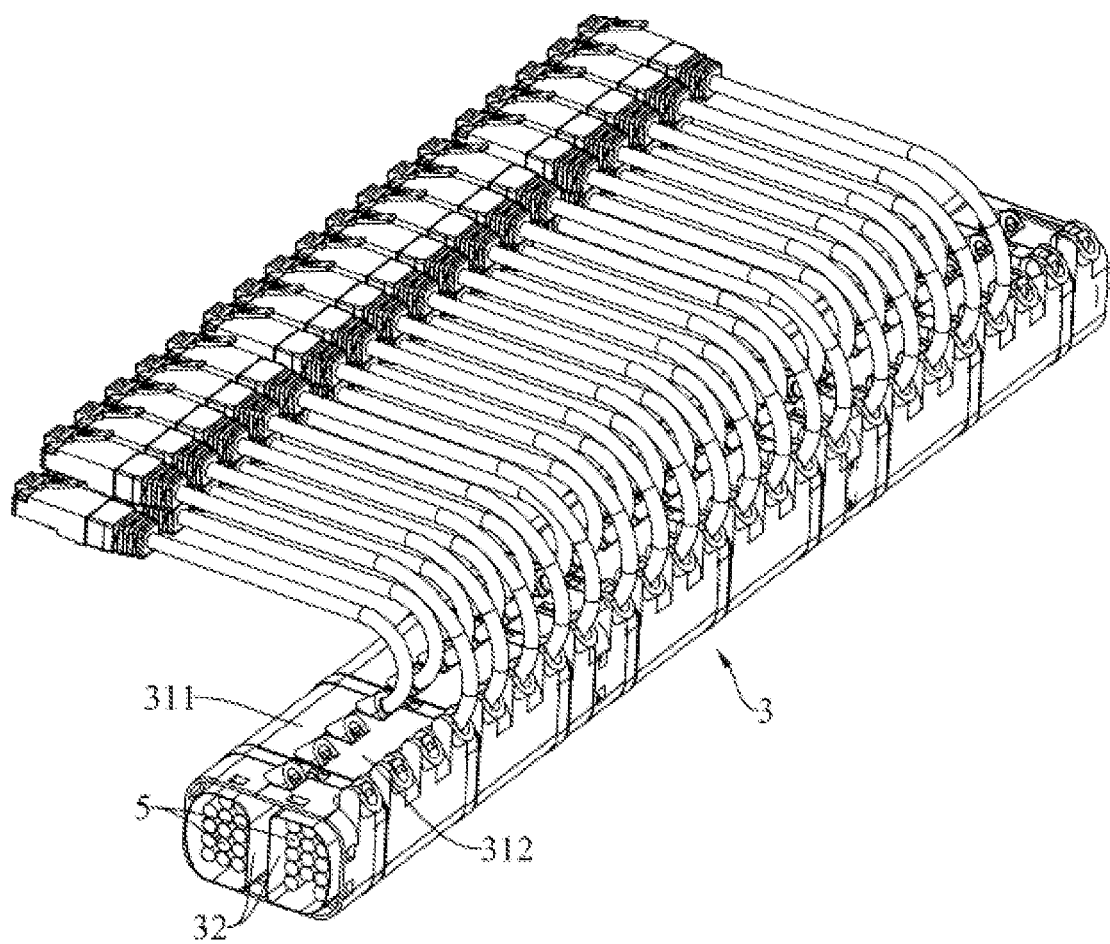
FIG. 6 is a schematic drawing of a cable management rack and cables according to another embodiment of the present disclosure.

As shown in FIGS. 2 and 6, the cable management rack 3 in the present embodiment further includes a plurality of cable-bundling sleeves 32, the plurality of cable-bundling sleeves 32 are spaced apart and sleeved on the cables 5 in the through hole 317. The setting of the cable-bundling sleeves 32 enables the cables 5 to be stably secured in the through hole 317, so that the cables 5 are more regular as a whole.

As shown in FIGS. 1 to 9, the embodiment further provides a cable management apparatus for a server cabinet. A plurality of brackets is disposed up and down for supporting servers 2 in the server cabinet 1. The cable management apparatus for a server cabinet includes the cable management rack 3, cable management racks 3 are vertically disposed in the server cabinet, and cable management racks 3 are horizontally disposed on the brackets. The cable management racks comprise vertically disposed cable management racks 301 and horizontally disposed management racks 302, the vertically disposed cable management racks 301 are vertically disposed in the server cabinet, and the horizontally disposed cable management racks 302 are horizontally disposed on the plurality of brackets. One ends of a plurality of cables 5 are connected to one vertically disposed cable management rack 3, and the other ends of the plurality of cables 5 are connected to one horizontally disposed cable management rack 3. Two ends of each cable 5 respectively pass through the cable guide outlets 316 on the corresponding cable management racks 3, and the cables 5 passing through the one horizontally disposed cable management racks 3 are connected to the server 2. Each server 2 is connected to at least horizontally disposed cable management rack 3, and each horizontally disposed cable management rack 3 is correspondingly connected to a vertically disposed cable management rack 3. It may be understood that the cables 5 passing through the vertically disposed cable management rack 3 can be connected to equipment such as a switch needing to be connected to the server 2.

In the embodiment, the vertically disposed cable management rack 3 and the horizontally disposed cable management rack 3 are provided so that, according to the actual number of cables 5 corresponding to each server 2, the cables 5 can be pre-assembled in the vertically disposed cable management rack 3 and the horizontally disposed cable management rack 3 and then be mounted in the server cabinet 1. The cables 5 are delivered after being pre-assembled, so that routing of the cables 5 is more regular, the assembly is convenient, and the wiring efficiency is improved.

As shown in FIG. 1, the upper side and the lower side of each horizontally disposed cable management rack 3 are separately provided with one vertically disposed cable management rack 3, the two vertically disposed cable management racks 3 are oppositely disposed, and cables 5 in the two vertically and oppositely disposed cable management racks 3 may be connected to one horizontally disposed cable management rack 3. Specifically, the cables 5 in the two vertically disposed cable management racks 3 are connected in one horizontally disposed cable management rack 3 after the two cables 5 converge so that the space in the server cabinet 1 can be fully utilized, and the wiring is more regular.

Further, the vertically disposed cable management racks 3 corresponding to different horizontally disposed cable management racks 3 are sequentially arranged, so that the wiring in the server cabinet 1 is more regular. Specifically, the server cabinet 1 includes stands 4 disposed at four corners of the server cabinet 1, the vertically disposed cable management rack 3 is securely connected to one of the stands 4 adjacent to the interface 22 of the server 2. Mounting grooves 41 are disposed in the stand 4, and respective cable management racks 3 are sequentially arranged in the mounting groove 41, so that the wiring can be more beautiful and regular. In addition, the mounting groove 41 can be provided with one or more vertically disposed cable management racks 3. Specifically, the cable management racks 3 can be configured according to the server cabinet 1 and the set requirement for use so that the purpose of modular assembly is achieved.

Figure 3:
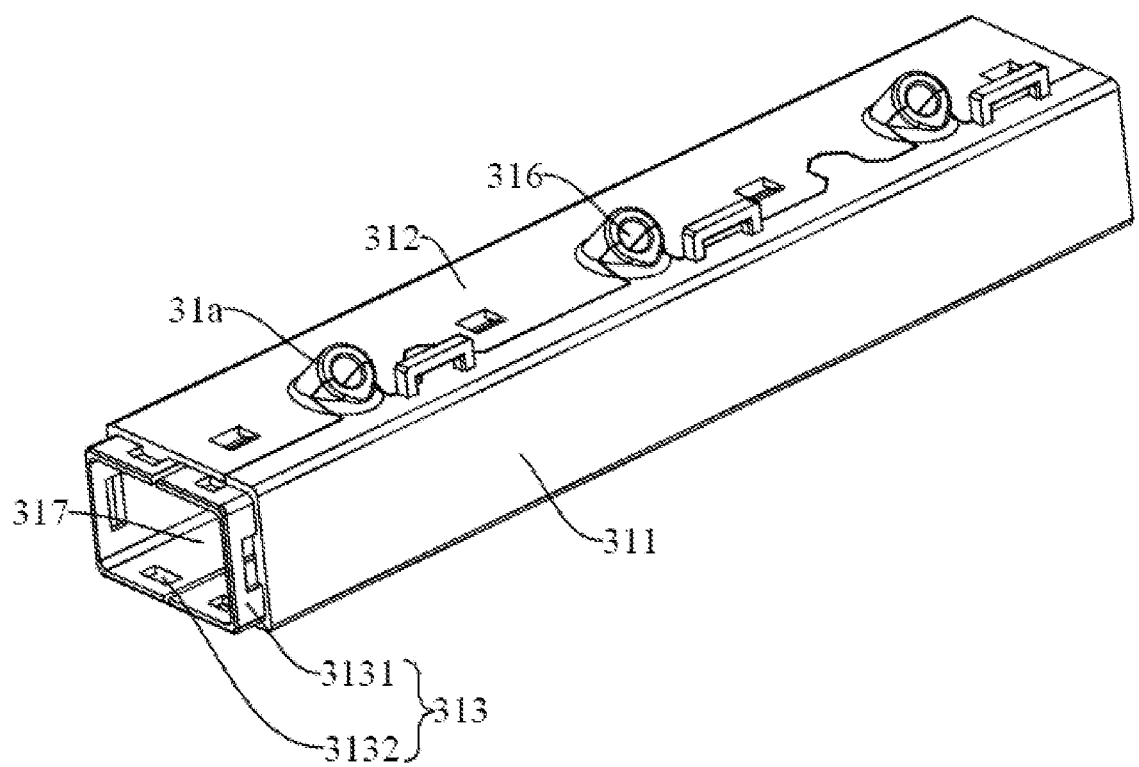
FIG. 3 is a schematic drawing of a cable-bundling unit according to an embodiment of the present disclosure.

In general, the vertical size of the server cabinet 1 is relatively large, and the number of cable guide outlets 316 that can be configured for the cables 5 to pass through is relatively large. As shown in FIGS. 2 to 4, a column of cable guide outlets 316 is formed on the cable-bundling unit 31 of the vertically disposed cable management rack 3, the first cable-bundling piece 311 and the second cable-bundling 312 are in U-shaped structures, and the opening side of the first cable-bundling piece 311 is butted against the opening side of the second cable-bundling piece 312. The column of cable guide outlets 316 is formed on the cable-bundling unit 31 of the vertically disposed cable management rack 3 so that mutual interference in the cables 5 on the same vertically disposed cable management rack 3 is avoided, and the cable sequence is more convenient to be distinguished.

In order to facilitate the connection of the first cable-bundling piece 311 to the second cable-bundling piece 312, as shown in FIG. 5, the outer sides of two opposite side walls of the first cable-bundling piece 311 are each provided with second engaging protrusions 3113 distributed along the extending direction of the through hole 317. Two opposite side walls of the second cable-bundling piece 312 are each provided with second engaging holes 3123 corresponding to the second engaging protrusions 3113, and each second engaging protrusion 3113 is engaged with one second engaging hole 3123.

As shown in FIG. 5, the outer sides of the two opposite side walls of the first cable-bundling piece 311 are each provided with engaging portions 3111 distributed along the extending direction of the through hole 317, the two opposite side walls of the second cable-bundling piece 312 are each provided with engaging recesses 3121 corresponding to the engaging portions 3111, and each engaging portion 3111 is engaged with one engaging recess 3121. Through the engagement between the engaging portions 3111 and the engaging recesses 3121, the connection reliability of the first cable-bundling piece 311 and the second cable-bundling piece 312 is improved.

A length of the horizontally disposed cable management rack 3 may be matched with a width of the server 2 on a side where the interface 22 is disposed and as shown in FIGS. 6 to 9, two columns of cable guide outlets 316 are formed on the cable-bundling unit 31 of the horizontally disposed cable management rack 3 in the embodiment, so that more cables 5 can be led out, and at the same time, the distance of the cable 5 from the cable guide outlet 316 to the interface 22 of the server 2 can be shortened, and thereby the wiring in the server cabinet 1 is more regular. Two side edges of the first cable-bundling piece 311 connected to the second cable-bundling piece 312 are separately provided with first guide portions 3112 extending along the extending direction of the through hole 317, and each first guide portion 3112 is internally provided with a first guide groove 31121. Two side edges of the second cable-bundling piece 312 connected to the first cable-bundling piece 311 are separately provided with second guide portions 3122 extending along the extending direction of the through hole 317, and each second guide portion 3122 is internally provided with a second guide groove 31221. When the first cable-bundling piece 311 is connected to the second cable-bundling piece 312, each first guide portion 3112 is butted against one second guide portion 3122 to form the cable guide outlet 316. Optionally, the first guide portion 3112 and the second guide portion 3122 are both a protrusion structure protruding from the first cable-bundling piece 311 or the second cable-bundling piece 312, and thus can improve the strength of the first cable-bundling piece 311 and the second cable-bundling piece 312.

Figure 8:
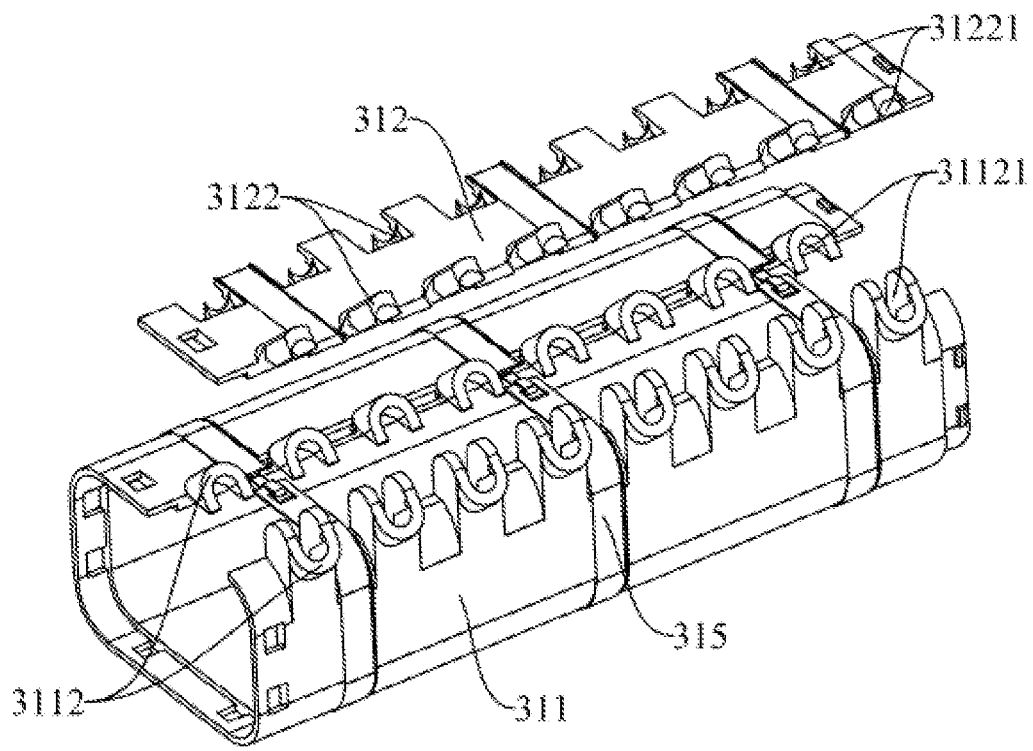
FIG. 8 is an exploded view of a cable-bundling unit according to another embodiment of the present disclosure.
Figure 9:
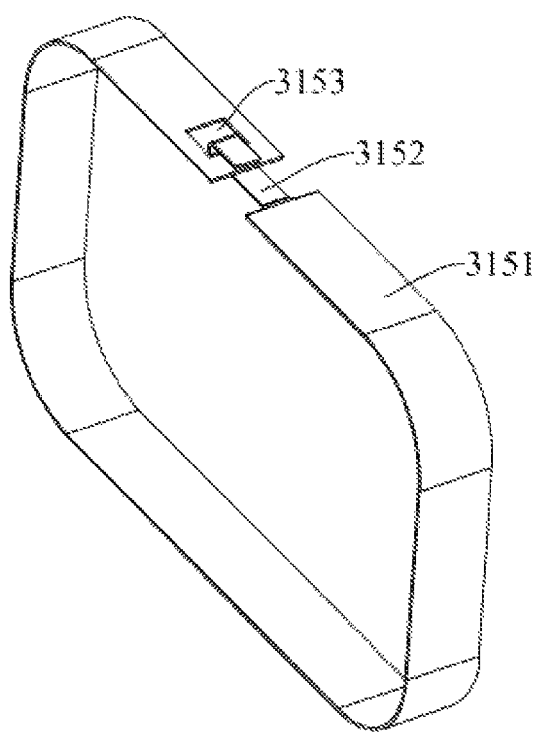
FIG. 9 is a schematic drawing of a fastener according to an embodiment of the present disclosure.

As shown in FIGS. 7 to 9, the cable-bundling unit 31 further includes a plurality of fasteners 315, and two ends of each fastener 315 are detachably connected. The plurality of fasteners 315 are spaced apart and wound around the first cable-bundling piece 311 and the second cable-bundling piece 312 along the extending direction of the through hole 317. The fasteners 315 are provided so that the first cable-bundling piece 311 and the second cable-bundling piece 312 can be more closely connected. Optionally, the fastener 315 includes a body 3151, one end of the body 3151 is provided with a hook 3152, and the other end of the body 3151 is provided with a hanging hole 3153. The hook 3152 can be hung in the hanging hole 3153 so that the fastener 315 can be conveniently disassembled and assembled.

Figure 10:
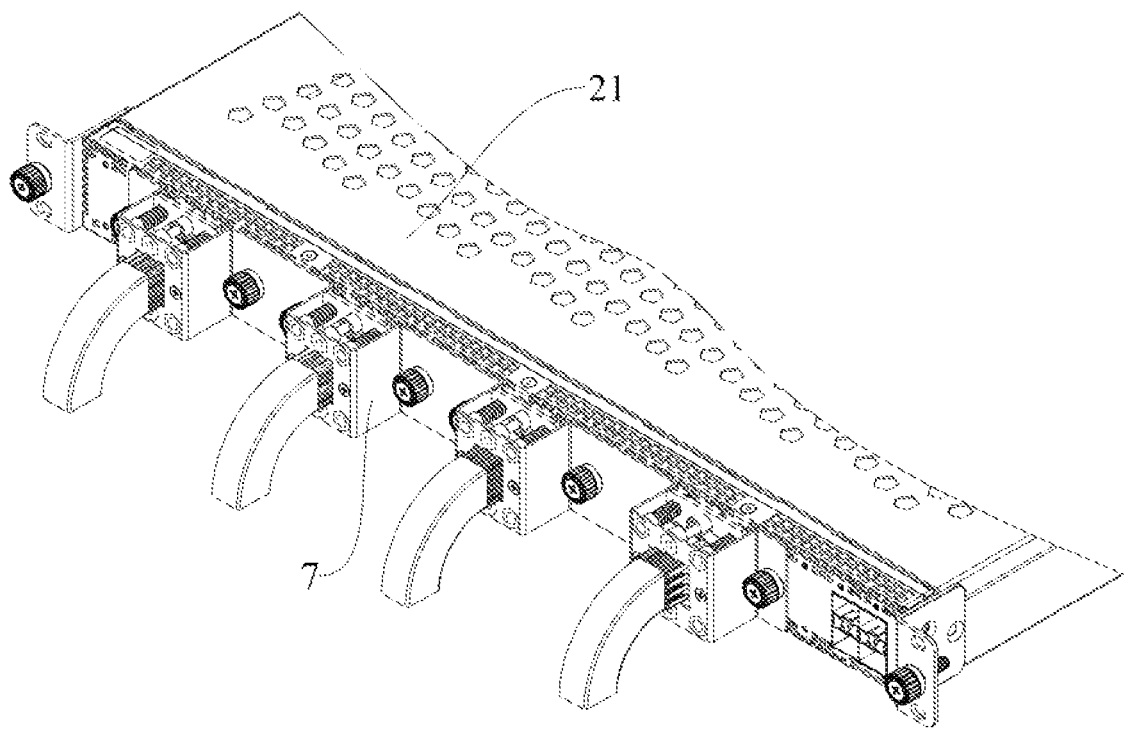
FIG. 10 is a partial schematic drawing showing a connection state of a floating connecting structure and a server body according to an embodiment of the present disclosure.
Figure 11:
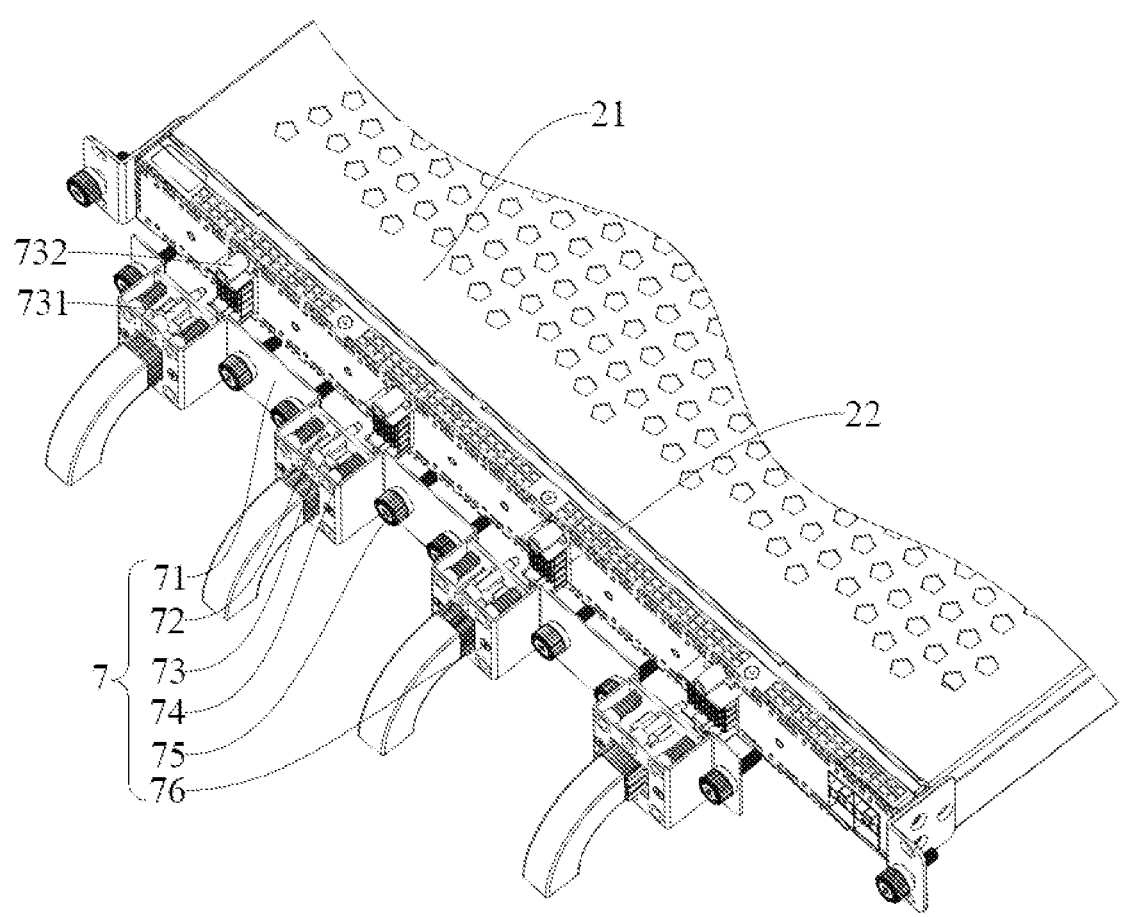
FIG. 11 is a partial schematic drawing showing a separation state of a floating connecting structure and a server body according to an embodiment of the present disclosure.
Figure 12:
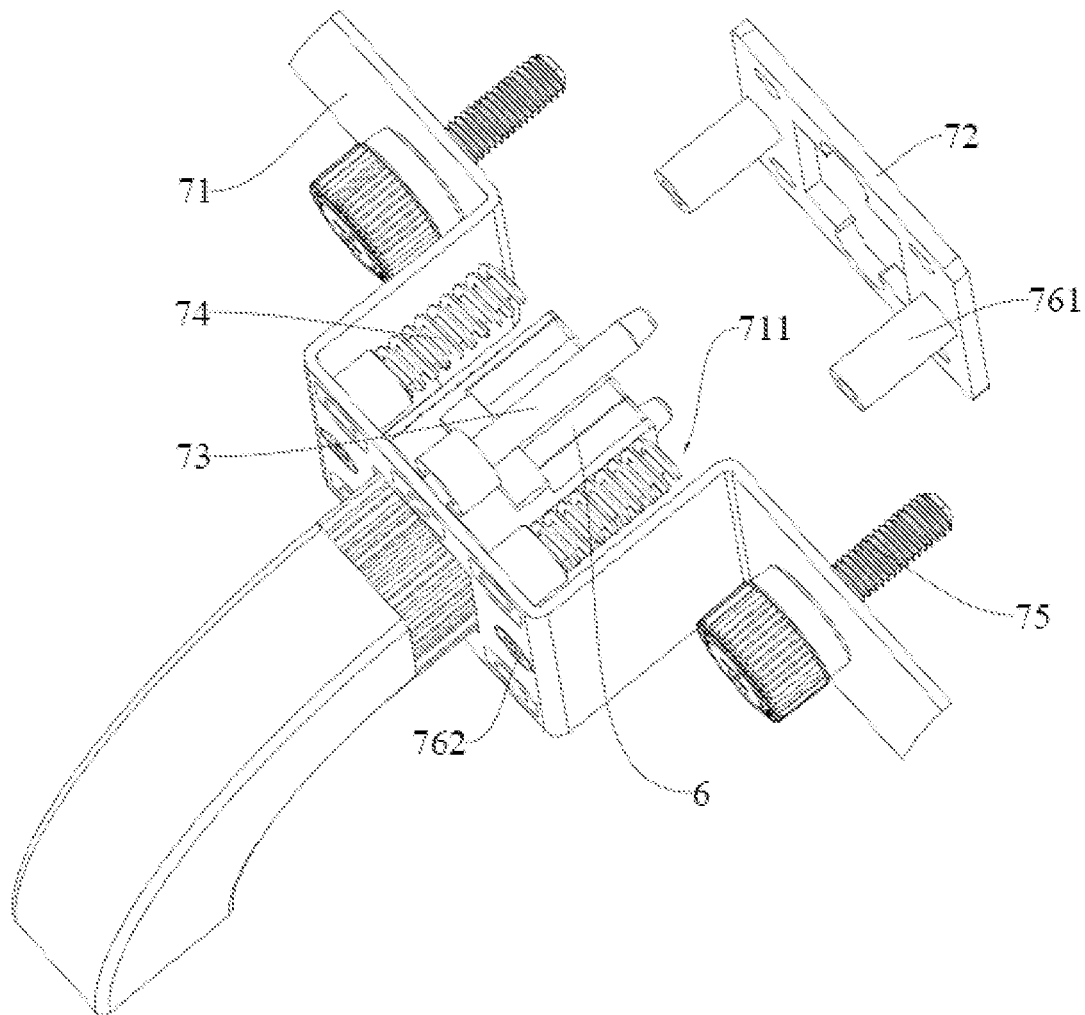
FIG. 12 is an exploded view of a floating connecting structure and a plug according to an embodiment of the present disclosure.

As shown in FIGS. 10 to 12, the cable management apparatus for a server cabinet in the embodiment further includes a floating connecting structure 7. The end part of the cable 5 on the horizontally disposed cable management rack 3 is connected with a plug 6 which is for being plugged in an interface 22 on the server 2, and the plug 6 is connected to the interface 22 through the floating connecting structure 7. The floating connecting structure 7 includes a mounting plate 71, a floating plate 72, a resilient member 74 and a first connecting member 75. The mounting plate 71 is provided with a slot 711, and the opening of the slot 711 faces towards the interface 22. The floating plate 72 is movably disposed in the slot 711, the plug 6 is located in the slot 711 and penetrates through the floating plate 72, and the cable 5 connected to the plug 6 penetrates through the mounting plate 71. Two ends of the resilient member 74 are respectively connected to the mounting plate 71 and the floating plate 72. The first connecting member 75 is disposed on the mounting plate 71, and the first connecting member 75 connects the mounting plate 71 and a server body 21.

It may be understood that when the plug 6 is plugged in the interface 22 to be assembled, the first connecting member 75 connects the mounting plate 71 and the server body 21, and meanwhile, the resilient force of the resilient member 74 acts on the floating plate 72, so that the connection between the plug 6 and the interface 22 can be more stable, and the shock resistance is improved. Optionally, the connecting member is a bolt, and the bolt is threadedly connected to the server body 21, so that a space for adjustment is provided when the plug 6 is connected to the interface 22, that is, the position where the screw is connected to the server body 21 is adjusted, and then the position where the plug 6 and the interface 22 are secured can be adjusted.

Optionally, the plurality of floating connecting structures 7 can share one mounting plate 71, and thus the plurality of plugs 6 are connected into a whole, so that the plugs 6 can be connected conveniently and at the same time can be prevented from being plugged into wrong positions, a foolproof function being provided.

As shown in FIG. 11 and FIG. 12, the floating connecting structure 7 further includes a guide member 73, and the guide member includes a guide post 731 and a guide sleeve 732. The plug 6 is plugged in the interface 22, the guide post 731 is connected to the mounting plate 71, and the guide sleeve 732 is disposed at the side part of the interface 22. The guide portion 73 is provided so that the plug 6 can be conveniently plugged in the interface 22.

Further, a second connecting member 76 is disposed between the floating plate 72 and the mounting plate 71. The second connecting member 76 includes a stud 762 and a standoff 761, the side of the floating plate 72 facing towards the mounting plate 71 is provided with the standoff 761, and a connecting hole is formed in the mounting plate 71 at the position corresponding to the standoff 761. After the plug 6 is plugged into the jack, the stud 762 is connected to the standoff 761 through the connecting hole.

The cable management apparatus for a server cabinet of the embodiment includes cable management racks 3. The cable management rack 3 includes the plurality of sequentially-connected cable-bundling units 31, and each cable-bundling unit 31 includes the first cable-bundling piece 311 and the second cable-bundling piece 312. The cables 5 are accommodated in the through hole 317 through the first cable-bundling piece 311 and the second cable-bundling piece 312. The cables 5 accommodated in the first cable-bundling piece 311 and the second cable-bundling piece 312 can be led out through different cable guide outlets 316, so that cables can be conveniently managed and different cables 5 can be conveniently distinguished. Two adjacent cable-bundling units 31 are detachably connected, and the through holes 317 of the plurality of cable-bundling units 31 are sequentially communicated for the cables 5 to be conveniently accommodated in the through holes 317. A cable management rack 3 is vertically disposed in the server cabinet 1, and a cable management rack 3 is horizontally disposed on the bracket. The cables 5 are pre-assembled in the vertically disposed cable management rack 3 and the horizontally disposed cable management rack 3 and then are mounted in the server cabinet 1. The cables 5 are delivered after being pre-assembled, so that the routing of the cables 5 is more regular, the assembly is convenient, and the wiring efficiency is improved. In addition, the cable management apparatus for a server cabinet of the embodiment further includes a floating connecting structure 7. The connection reliability of the plug 6 and the interface 22 can be improved through the setting of the floating connecting structure 7.

The cable management rack provided by the present disclosure includes a plurality of cable-bundling units connected sequentially. Each of the cable-bundling units includes a first cable-bundling piece and a second cable-bundling piece detachably connected to the first cable-bundling piece. A through hole for cables to pass through is formed between the second cable-bundling piece and the first cable-bundling piece. Through the setting of the first cable-bundling piece and the second cable-bundling piece, the cable can be easily accommodated in the through hole. A plurality of cable guide outlets are formed on the first cable-bundling piece and the second cable-bundling piece and are spaced apart and distributed along an extending direction of the through hole, the cable guide outlet is provided with a guide structure to guide the outlet direction of the cable, so that different cables can be led out through different cable guide outlets, and thus cables can be conveniently managed and different cables can be conveniently distinguished. Two adjacent cable-bundling units are detachably connected, through holes of the plurality of cable-bundling units are sequentially communicated, and thus the cables can be conveniently accommodated in the through holes.

The cable management apparatus for a server cabinet provided by the present disclosure includes the preceding cable management rack, and through the setting of the cable management rack, the cables can be delivered after being pre-assembled, thus making the cable routing regular and improving the wiring efficiency. Through the setting of the floating connecting structure for the connection with the server, the plug can be more stably connected to the interface, and thus the effects of eliminating tolerances generated during the connecting process and preventing the plug from being plugged in a wrong position can be achieved.

The technical principle of the present disclosure is described above in conjunction with embodiments. The description is merely used for explaining the principle of the present disclosure, and is not intended to explain as limitations to the protection scope of present disclosure in any means. Based on the explanations herein, other embodiments of the present disclosure obtained by those skilled in the art without creative work are within the scope of the present disclosure.

What is claimed is:

1. A cable management apparatus for a server cabinet internally provided with a plurality of brackets arranged up and down for supporting servers, the cable management apparatus comprising cable management racks, each of the cable management racks comprising a plurality of cable-bundling units sequentially connected, wherein each of the plurality of cable-bundling units comprises:
   a first cable-bundling piece,
   a second cable-bundling piece, which is detachably connected to the first cable-bundling piece,
   a through hole for cables to pass through, which is formed between the second cable-bundling piece and the first cable-bundling piece,
   a plurality of cable guide outlets, which are formed on the first cable-bundling piece, and the second cable-bundling piece and are spaced apart and distributed along an extending direction of the through hole, wherein each of the plurality of cable guide outlets is provided with a guide structure to guide an outlet direction of cables;

wherein two adjacent cable-bundling units are detachably connected, and through holes of the plurality of cable-bundling units are sequentially communicated;

wherein the cable management racks comprise vertically disposed cable management racks and horizontally disposed management racks, the vertically disposed cable management racks are vertically disposed in the server cabinet, and the horizontally disposed cable management racks are horizontally disposed on the plurality of brackets;

one ends of a plurality of cables are connected to one vertically disposed cable management rack, the other ends of the plurality of cables are connected to one horizontally disposed cable management rack, two ends of each of the plurality of cables respectively pass through cable guide outlets on the corresponding cable management racks, and the plurality of cables passing through the one horizontally disposed cable management rack are connected to at least one of the servers; and each of the servers is correspondingly connected to at least one of the horizontally disposed cable management racks, and each of the horizontally disposed cable management racks is connected to a respective one of the vertically disposed cable management racks.

2. The cable management apparatus for the server cabinet according to claim 1, wherein one column of cable guide outlets is formed on the cable-bundling unit of each of the vertically disposed cable management racks, the first cable-bundling piece and the second cable-bundling piece are in U-shaped structures, and an opening side of the first cable-bundling piece is butted against an opening side of the second cable-bundling piece.

3. The cable management apparatus for the server cabinet according to claim 2, wherein outer sides of two opposite side walls of the first cable-bundling piece are each provided with engaging protrusions distributed along the extending direction of the through hole; and two opposite side walls of the second cable-bundling piece are each provided with engaging holes corresponding to the engaging protrusions, and each of the engaging protrusions is engaged with a respective one of the engaging holes.

4. The cable management apparatus for the server cabinet according to claim 2, wherein outer sides of two opposite side walls of the first cable-bundling piece are each provided with engaging portions distributed along the extending direction of the through hole, two opposite side walls of the second cable-bundling piece are each provided with engaging recesses corresponding to the engaging portions, and each of the engaging portions is engaged with a respective one of the engaging recesses.

5. The cable management apparatus for the server cabinet according to claim 1, wherein two columns of cable guide outlets are formed in the cable-bundling unit of each of the horizontally disposed cable management racks; two side edges of the first cable-bundling piece connected to the second cable-bundling piece are separately provided with first guide portions extending along the extending direction of the through hole, and each of the first guide portions is internally provided with a first guide groove; two side edges of the second cable-bundling piece connected to the first cable-bundling piece are separately provided with second guide portions extending along the extending direction of the through hole, and each of the second guide portions is internally provided with a second guide groove; and in a case where the first cable-bundling piece is connected to the second cable-bundling piece, each of the first guide portions is butted against a respective one of the second guide portions to form the cable guide outlet.

6. The cable management apparatus for the server cabinet according to claim 5, wherein the cable-bundling unit further comprises:
   a plurality of fasteners, wherein two ends of each of the plurality of fasteners are detachably connected, and the plurality of fasteners are spaced apart and wound around the first cable-bundling piece and the second cable-bundling piece along the extending direction of the through hole.

7. The cable management apparatus for the server cabinet according to claim 1, further comprising a floating connecting structure, wherein an end part of a cable on each of the horizontally disposed cable management racks is connected with a plug which is for being plugged in an interface on a server, the plug is connected to the interface through the floating connecting structure, and the floating connecting structure comprises:
   a mounting plate, which comprises a slot and an opening of the slot faces towards the interface;
   a floating plate, which is movably disposed in the slot, wherein the plug is located in the slot and penetrates through the floating plate, and the cable connected to the plug penetrates through the mounting plate;
   a resilient member, wherein two ends of the resilient member are respectively connected to the mounting plate and the floating plate; and
   a first connecting member, which is disposed on the mounting plate and configured to connect the mounting plate to a server body.

8. The cable management apparatus for the server cabinet according to claim 7, wherein the floating connecting structure further comprises:
   a guide member, which comprises a guide post and a guide sleeve, wherein in a case where the plug is plugged in the interface, the guide post is connected to the mounting plate, and the guide sleeve is disposed on a side part of the interface.

9. The cable management apparatus for the server cabinet according to claim 1, wherein the guide structure has an included angle θ relative to the first cable-bundling piece and the second cable-bundling piece, and the cable is obliquely led out through each of the plurality of cable guide outlets.

10. The cable management apparatus for the server cabinet according to claim 9, wherein the guide structure comprises a first guide portion and a second guide portion, the first guide portion is internally provided with a first guide groove, the second guide portion is internally provided with a second guide groove; and in a case where the first cable-bundling piece is connected to the second cable-bundling piece, the first guide portion is butted against the second guide portion to form each of the plurality of cable guide outlets.

11. The cable management apparatus for the server cabinet according to claim 1, each of the cable management racks further comprises a plurality of cable-bundling sleeves, and the plurality of cable-bundling sleeves are spaced apart and sleeved on the cables in the through hole.

12. The cable management apparatus for the server cabinet according to claim 1, wherein each of the plurality of cable-bundling units further comprises:
   a first connecting structure, which is disposed at one end of the first cable-bundling piece and the second cable-bundling piece; and
   a second connecting structure, which is disposed at the other end of the first cable-bundling piece and the second cable-bundling piece,
   wherein the first connecting structure of each of the plurality of cable-bundling units is connected to the second connecting structure of the adjacent cable-bundling unit.

13. The cable management apparatus for the server cabinet according to claim 12, wherein
   the first connecting structure comprises a first splicing section and a plurality of first engaging protrusions, and the first splicing section is disposed at the one end of the first cable-bundling piece and the second cable-bundling piece;
   the second connecting structure comprises a second splicing section, the second splicing section is disposed at the other end of the first cable-bundling piece and the second cable-bundling piece, and the second splicing section is provided with a plurality of first engaging holes; and
   the end of each of the plurality of cable-bundling units provided with the plurality of first engaging holes is spliced with the end of the adjacent cable-bundling unit provided with the plurality of first engaging protrusions, and each of the plurality of first engaging protrusions is engaged with a respective one of the plurality of first engaging holes.

* * * * *